United States Patent [19]

Callahan

[11] Patent Number: 5,418,486
[45] Date of Patent: May 23, 1995

[54] UNIVERSAL DIGITAL FILTER FOR NOISY LINES

[75] Inventor: John M. Callahan, Fremont, Calif.

[73] Assignee: VLSI Technology, Inc., San Jose, Calif.

[21] Appl. No.: 188,288

[22] Filed: Jan. 28, 1994

[51] Int. Cl.$^6$ .................. H03K 17/16; H03K 5/00
[52] U.S. Cl. ........................ 327/310; 327/26; 327/392; 327/261; 327/552
[58] Field of Search ............ 307/247.1, 520, 521, 307/603, 542, 542.1, 543, 556, 234, 518; 328/167, 162, 166, 111, 112

[56] References Cited

U.S. PATENT DOCUMENTS 4,525,635 6/1985 Guilberg ................. 302/542.1
5,001,374 3/1991 Chang .................... 302/543

*Primary Examiner*—Timothy P. Calahan
*Assistant Examiner*—Le Dinh
*Attorney, Agent, or Firm*—Patrick T. King; John P. Wagner, Jr.

[57] ABSTRACT

A noise-suppression logic system suppresses a noise signal having a time duration which is less than a predetermined time. A delay circuit has a delay which is equal to the predetermined time. A logic combining circuit is coupled to the system input terminal and to the output terminal of the delay circuit. A R-S latch circuit, having a RESET input terminal, a SET input terminal, and an OUTPUT terminal provides a delayed output signal corresponding to an input signal which has a time duration greater than the predetermined time. A set circuit has a first input terminal coupled to the system input terminal, a second input terminal coupled to the output terminal of the delay circuit, and an output terminal coupled to the SET input terminal of the R-S flip-flop circuit. A reset circuit has a first input terminal coupled through an inverter to the system input terminal, has a second input terminal coupled to the output terminal of the logic combining circuit, and has an output terminal coupled to the RESET input terminal of the R-S flip-flop circuit. A method is provided for logically suppressing a noisy input signal having a time duration which is less than a predetermined time. The method includes delaying the input signal for the predetermined time and combining the input signal with the delayed input signal. A set signal for a RS latch circuit is formed by combining the input signal with the delayed input signal. A reset signal for the RS flip-flop is provided by logically combining the input signal, the delayed input signal, and an inverted input signal. A delayed output signal from the RS latch corresponds to an input signal which has a time duration greater than the predetermined time.

18 Claims, 5 Drawing Sheets

UNIVERSAL DIGITAL FILTER FOR NOISY LINES

BACKGROUND OF THE INVENTION

1. Field of the Invention

This invention relates to digital logic circuits and, more particularly, to techniques for making digital logic circuits insensitive to spurious input signals and ground spikes on, for example, signal lines for interrupt signals.

2. Prior Art

The feature sizes of the devices on semiconductor integrated circuits are becoming increasingly smaller so that integrated-circuit dies are much more densely packed. The various devices are much closer to each other and signal lines are laid out with much closer spacings. The frequency of operation of these more densely packed integrated circuits are also increasing. The result is that integrated circuits are operating with increased internal crosstalk and with more cross coupled electronic noise.

Attempts to moderate this problem have been made by reducing noise pickup on signal and power buses by use of various I/O and bussing designs. Reduction of internal crosstalk noise in a densely packed integrated circuits has not been effectively addressed. For example, in a 32-bit bus system where the tri-state bus driver circuits are latched into a high-impedance state, the bus driver circuits are particularly susceptible to crosstalk pickup because of their high impedance state. As another example, each of two signal lines adjacent to a third signal line may have signals going in opposite directions. The third signal line may pickup signals from both of the adjacent signal lines such that the signal on the third signal line appears to be delayed.

The need has arisen for a technique to discriminate against unwanted noise bursts and crosstalk signal pulses within an integrated circuit, and, in particular, on interrupt signal lines for a microcomputer.

SUMMARY OF THE INVENTION

It is therefore an object of the invention to provide a technique for suppressing spurious, unwanted logic signals within an integrated circuit.

In accordance with this and other objects of the invention, a logic noise-suppression system is provided for logically suppressing a noise signal having a time duration which is less than a predetermined time. A delay circuit has its input terminal coupled to the system input terminal. The delay time of the delay circuit is equal to the predetermined time. A logic combining circuit has a first input terminal coupled to the system input terminal and a second input terminal coupled to the output terminal of the delay circuit. The logic combining circuit provides an output signal used for resetting a latch circuit.

A R-S latch circuit, having a RESET input terminal, a SET input terminal, and an OUTPUT terminal provides a delayed output signal corresponding to an input signal which has a time duration greater than the predetermined time.

A set circuit has a first input terminal coupled to the system input terminal, a second input terminal coupled to the output terminal of the delay circuit, and an output terminal coupled to the SET input terminal of the R-S flip-flop circuit. A reset circuit has a first input terminal coupled through an inverter to the system input terminal, has a second input terminal coupled to the output terminal of the logic combining circuit, and has an output terminal coupled to the RESET input terminal of the R-S flip-flop circuit.

In a preferred embodiment of the invention, the logic combining circuit includes a NOR gate, the R-S latch circuit includes a pair of cross-coupled NOR gates, the set circuit includes an AND gate, and the reset circuit includes an AND gate. In another preferred embodiment of the invention, the logic combining circuit includes a NAND gate, the R-S latch circuit includes a pair of cross-coupled NAND gates, the set circuit includes an OR gate, and the reset circuit includes the logic combining circuit.

Various types of delay circuits include, for example, two serially connected inverter circuits or a shunt capacitor connected to the input terminal of the second of the two serially connected inverter circuits. The delays are adjustably controlled and can be controlled by controlling the current through the inverter circuits.

A method is provided for logically suppressing a noisy input signal having a time duration which is less than a predetermined time. The method includes delaying the input signal for the predetermined time and combining the input signal with the delayed input signal. A set signal for a RS latch circuit is formed by combining the input signal with the delayed input signal. A reset signal for the RS flip-flop is provided by logically combining the input signal, the delayed input signal, and an inverted input signal. A delayed output signal from the RS latch corresponds to an input signal which has a time duration greater than the predetermined time.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
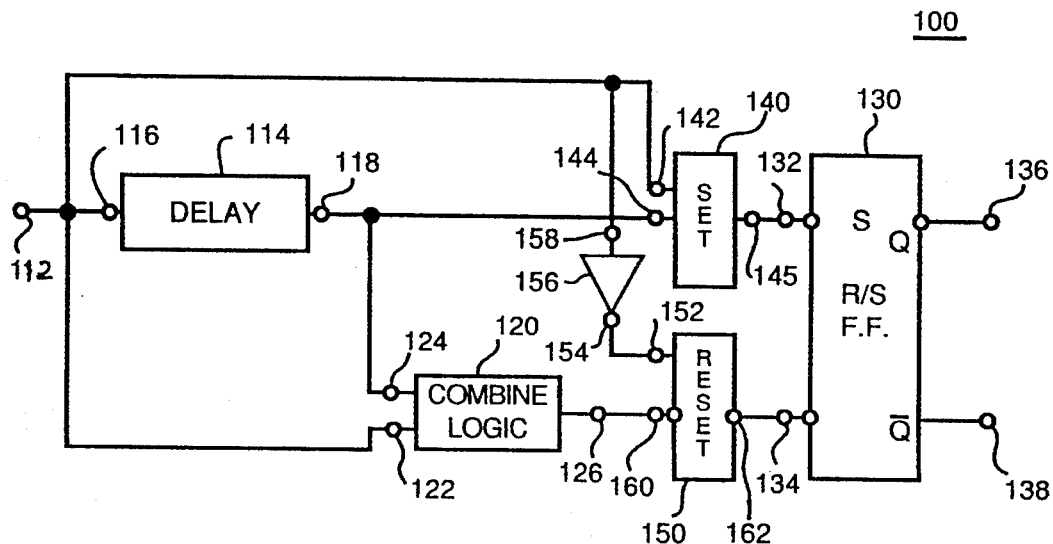
FIG. 1 is a block diagram of a logic noise-suppression system according to the invention.

FIG. 1 shows a block diagram of a logic noise-suppression system 100 for logically suppressing a noise signal which has a time duration less than a predetermined time. A system input terminal 112 is provided for receiving an input signal, which can be either a desirable signal or an undesirable noise signal. A desirable signal has a time duration, or width, greater than a predetermined time while an undesirable noise signal has a width less than a predetermined time. The system 100 is designed to suppress undesirable input signals having a time duration, or width, less than the predetermined time.

A time-delay circuit 114 has an input terminal 116 coupled to the system input terminal 112. The delay time of the time-delay circuit 114 is set to the predetermined time. The time-delay circuit 114 includes an output terminal 118. A number of different types of time-delay lines or circuits may be used. Several exemplary implementations are described herein below.

A logic combining circuit 120 has a first input terminal 122 which is coupled to the system input terminal 112. A second input terminal 124 of the circuit 120 is coupled to the output terminal 118 of the delay circuit 114. The logic combining circuit 120 has an output terminal 126 at which is provided a logic output signal. The function of the logic combining circuit 120 is to monitor an input signal and a delayed version of the input signal in order to provide an output signal indicating that both the input signal and a delayed version of the input signal are at an inactive, or LOW, state.

A R-S latch circuit 130 is provided as part of a latch arrangement for latching a desirable, valid input signal, that is, an input signal having a time duration greater than the predetermined time. The R-S latch circuit 130 has a SET input terminal 132, a RESET input terminal 134, and a Q output terminal 136. At the Q output terminal 136 is provided an output signal which is a delayed version of a valid input signal.

A set circuit 140 for the R-S latch circuit 130 has a first input terminal 142 which is coupled to the system input terminal 112. A second input terminal 144 is coupled to the output terminal 118 of the delay circuit 114. The set circuit 140 has an output terminal 144 coupled to the SET input terminal 132 of the R-S latch circuit 130. The set circuit 140 functions to monitor an input signal and a delayed version of the input signal in order to provide an output signal indicating that both the input signal and a delayed version of the input signal are simultaneously at an active, or HIGH, state.

A reset circuit 150 for the R-S latch circuit 130 has a first input terminal 152 which is coupled to the output terminal 154 of an inverter circuit 156. The inverter circuit 156 has input terminal 158 to the system input terminal 112. The reset circuit 150 has a second input terminal 160 which is coupled to the output terminal 126 of the logic combining circuit 120. The reset circuit 150 has an output terminal 162 coupled to the RESET input terminal 134 of the R-S latch circuit 130. The reset circuit 150 functions to monitor an inverted input signal and the signal at the output terminal 126 of the logic combining circuit 120.

The function of the noise-suppression system 100 is to discriminate against, or logically suppress, signals applied to the input terminal 112 which have a time duration, or pulse width, less than a predetermined time. The predetermined time is equal to the delay time of the time-delay circuit 114. The delay time of the time-delay circuit can be adjustable, if desired, as described herein below.

Figure 2:
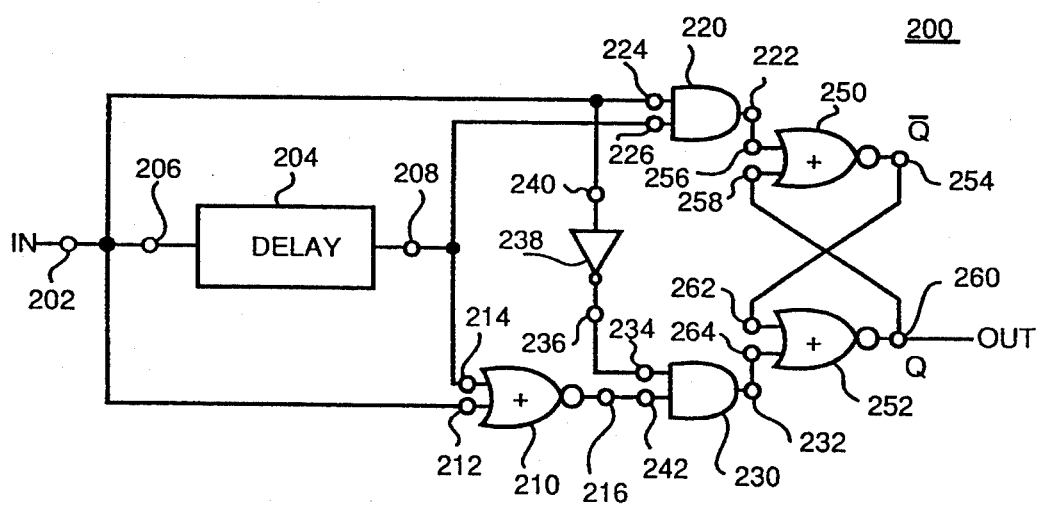
FIG. 2 is a more detailed circuit diagram of a logic noise-suppression system which uses a NOR flip-flop circuit according to the invention.

FIG. 2 shows a more detailed circuit diagram of a particular preferred embodiment of a noise-suppression system 200. This particular preferred embodiment of the invention uses a R-S flip-flop circuit formed of cross-coupled NOR gates.

A system input terminal 202 receives an input signal, which can be either a desirable signal, which has a time duration, or width, greater than a predetermined time, or an undesirable, noise signal with a width less than the predetermined time.

A time-delay circuit 204 is provided which has an input terminal 206 coupled to the system input terminal 202. The delay time of the delay circuit 204 is set to the predetermined time. The time-delay circuit 204 includes an output terminal 208.

A logic combining circuit is provided by a NOR gate 210 which has a first input terminal 212 coupled to the system input terminal 202. A second input terminal 214 is coupled to the output terminal 208 of the delay circuit 204. The NOR gate 210 has an output terminal 216 which provides a logic signal produced by the logical combination of signals at its input terminals. The function of the logic combining circuit is to monitor an input signal and a delayed version of the input signal in order to provide an output signal indicating that both the input signal and a delayed version of the input signal are at an inactive, or LOW, state.

A set circuit includes an AND gate 220 with its output terminal 222. A first input terminal 224 for the AND gate 220 is coupled to the system input terminal 202 for the system 200. A second input terminal 226 of the AND gate 220 is coupled to the output terminal 208 of the delay circuit 204. The set circuit functions to monitor an input signal and a delayed version of the input signal in order to provide an output signal indicating that both the input signal and a delayed version of the input signal are simultaneously at an active, or HIGH, state.

A reset circuit includes an AND gate 230 with an output terminal 232. A first input terminal 234 for the AND gate 230 is coupled to output terminal 236 of an inverter 238. The input terminal 240 of the inverter 238 is coupled to the system input terminal 202. The reset AND gate 230 has a second input terminal 242 coupled to the output terminal 216 of the logic combining circuit provided by the NOR gate 210. The reset circuit functions to monitor an inverted input signal and the signal at the output terminal of the logic combining NOR gate 210.

In this embodiment of the invention, the R-S latch circuit includes a pair of cross-coupled NOR gates formed of a first NOR gate 250 and a second NOR gate 252. The first NOR gate 250 has an output terminal 254, a first input terminal 256, and a second input terminal 258. The second NOR gate 252 has an output terminal 260, a first input terminal 262, and a second input terminal 264. The output terminal 254 of the first NOR gate 250 is coupled to the first input terminal 262 of the second NOR gate 252. The first input terminal 256 of the first NOR gate 250 is coupled to the output terminal 222 of the Set AND gate 220. The second input terminal 258 of the first NOR gate 250 is coupled to the output terminal 260 of the second NOR gate 252. The second input terminal 264 of the second NOR gate 252 is coupled to the output terminal 232 of the reset AND gate 230. The output terminal 260 of the second NOR gate 252 is the Q output terminal for the flip-flop formed by the NOR gates 250, 252.

The function of the noise-suppression system 200 is to discriminate against, or logically suppress, signals applied to the input terminal 202 which have a time duration, or pulse width, less than a predetermined time. The predetermined time can be adjustable, if desired, and is equal to the delay time of the time-delay circuit 204.

An advantage of the preferred embodiment of the invention of FIG. 2 is that the delay for both set and reset functions is approximately the same. The delay paths for each function each includes a delay through the delay circuit 204 and through two NOR gates. For a set function, the set signal path is through the two NOR gates 250, 252. For a reset function, the reset signal path is through the two NOR gates 210 and 252.

Figure 3:
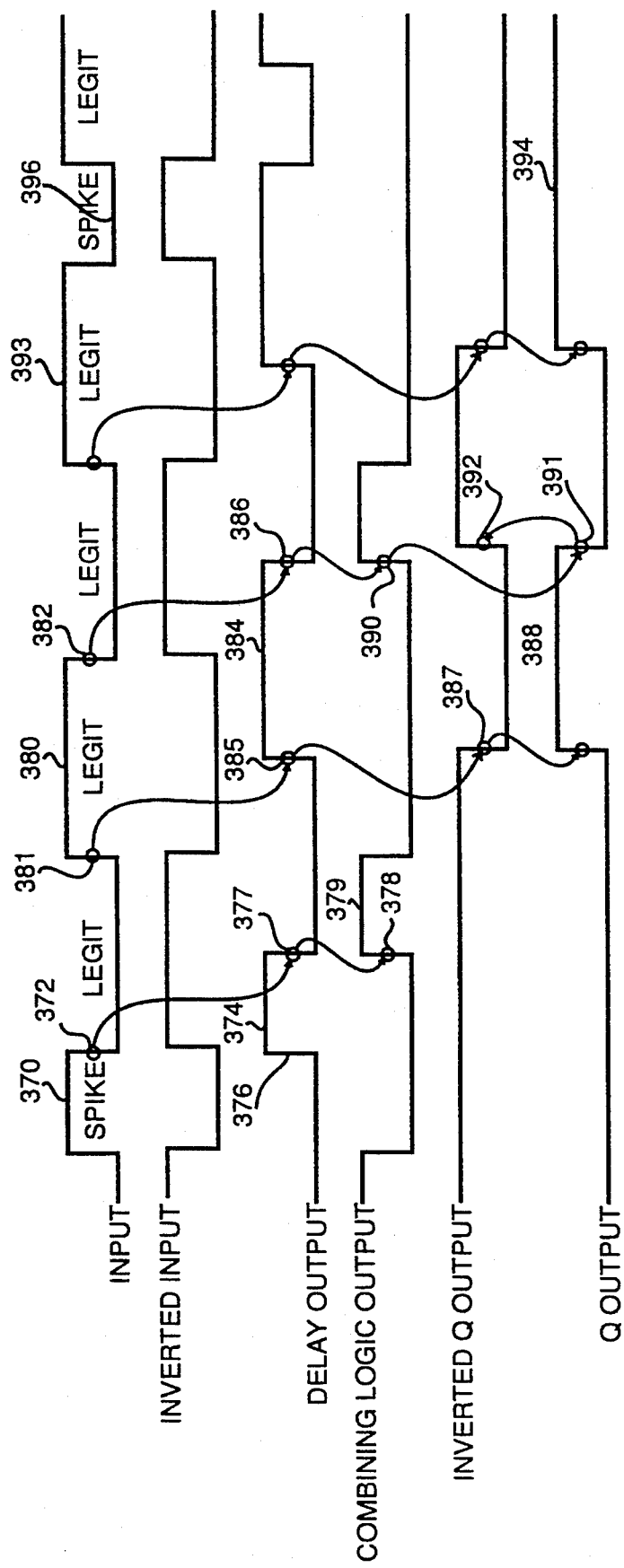
FIG. 3 is a timing diagram for operation of the circuit of FIG. 2, showing rejection of a spurious signal and acceptance of a legitimate signal.

FIG. 3 is a timing diagram illustrating operation of the circuit of FIG. 2, which uses a pair of cross-coupled NOR gate for the R-S flip-flop. The diagram shows, respectively from top to bottom: a typical input signal INPUT signal provided at the system input terminal 202; an INVERTED INPUT signal provided at the output terminal 236 of the inverter 238; a DELAY OUTPUT signal provided at terminal 208; a COMBINING LOGIC OUTPUT signal provided at terminal 216; an INVERTED OUTPUT signal provided at terminal 254 of the RS flip-flop; and a noise-suppression system Q OUTPUT signal provided at terminal 260 of the R-S flip-flop. FIG. 3 shows a number of leadlines connected between the edges of various signals. The leadlines have arrowheads at one ends to indicate that the signal with the arrowhead is changed as a result of the signal at the other end of the leadline.

To aid in analysis of the operation of the logic elements described in this application, the following truth tables are provided for 2-input gates. A "1" indicates a HIGH state and a "0" indicates a LOW state:

| INPUT 1 | INPUT 2 | OUTPUT |
|---|---|---|
| AND GATE: | | |
| 0 | 0 | 0 |
| 0 | 1 | 0 |
| 1 | 0 | 0 |
| 1 | 1 | 1 |
| NOR GATE: | | |
| 0 | 0 | 1 |
| 0 | 1 | 0 |
| 1 | 0 | 0 |
| 1 | 1 | 0 |
| NAND GATE: | | |
| 0 | 0 | 1 |
| 0 | 1 | 1 |
| 1 | 0 | 1 |
| 1 | 1 | 0 |
| OR GATE: | | |
| 0 | 0 | 0 |
| 0 | 1 | 1 |
| 1 | 0 | 1 |
| 1 | 1 | 1 |

Response to a Noise Pulse

Referring to FIG. 3, noise pulse 370, having a width slightly less than the delay time of the delay circuit 204, is provided at the system input terminal 202. The delay circuit 204 has a delay slightly greater than the width of the noise pulse 370. The delay circuit 204 provides a delayed pulse 374. The trailing edge 372 of the noise pulse 370 occurs before the leading edge 376 of the delayed pulse 374. Consequently, the signals at the input terminals 224, 226 of the set AND gate 220 do not simultaneously have HIGH inputs. This keeps the output terminal of the AND gate 220 at a LOW state.

Note that since the edge 372 occurs before the edge 376, as mentioned previously, it is possible to get an output spike out of the NOR Gate 210. This spike, in combination with an inverted output signal out of the inverter 238, acts to reset the flip-flop Q output. This is a don't care situation, since the Q output is already reset. This operation is shown by pulse 379 at the combining logic output terminal.

When the input signal at terminal 202 goes to a LOW state, the output terminal 236 of the inverter 238 goes to a HIGH state. Also, when the input signal at terminal 202 goes to a low state, the input terminal 212 of NOR gate 210 follows immediately. After the delay at 204, input signal at terminal 214 goes LOW. Then, output signal at terminal 216 goes HIGH. This provides a HIGH state input signal to the other input terminal 242 of the reset AND gate 230. The output state of terminal 232 of the AND gate 230 therefore goes to a HIGH state. Consequently, the input terminal 264 of the NOR gate 252 of the R-S flip-flop is at a HIGH state. A HIGH state at any input terminal of a NOR gate causes the Q output terminal 260 to be at a LOW state.

Note that a LOW state at terminal 260 provides a LOW state at input terminal 258 of the NOR gate 250. Since both input terminals of the NOR gate 250 are at LOW states, the output terminal 254 of the NOR gate 250 is at a HIGH state.

Response to Legitimate Signals

A legitimate positive signal pulse 380, having a width significantly greater than the delay time of the delay circuit 204 is provided at the system input terminal 202. The legitimate signal pulse 380 has a rising leading edge 381 and a falling trailing edge 382. The delay circuit 204 has a delay significantly less than the width of the legitimate signal pulse 380. The delay circuit 204 provides a delayed output pulse 384 at terminal 208 which is a time-delayed version of the input signal pulse 380. The delayed output pulse 384 has a rising leading edge 385, and a falling trailing edge 386.

The HIGH states of the legitimate signal pulse and the delayed output pulse 384 overlap in time so that the signals at the input terminals 224, 226 of the set AND gate 220 simultaneously have HIGH inputs. This causes the signal at the output terminal 222 of the AND gate 220 to go to the HIGH state. Any HIGH signal state on either input terminal 256, 258 of the NOR gate 250 of the R-S flip-flop causes a LOW signal state at the output terminal 254 of the R-S flip-flop. The LOW signal state at terminal 254 is coupled to the input terminal 262 of the other NOR gate 252 of the R-S flip-flop. Since both of the signals at the input terminals 262, 264 of the NOR gate 252 are in the LOW states, the pulse signal 388 at the Q output terminal 260 goes to a HIGH state.

When the legitimate input pulse signal 380 goes to a legitimate LOW state, as indicated by the signal waveform following the trailing edge 382 going to a LOW state for a time greater than the predetermined delay time, the delayed signal at the output terminal 208 of the delay circuit 204 drops, after the predetermined delay time, to a LOW state, as indicated by the trailing edge 386. The output signal at the output terminal 216 of the combining NOR gate 210 then goes to a HIGH state as indicated by the rising edge 390, which provides a HIGH state for the signal at the input terminal 242 of the reset AND gate 230. The other input terminal 234 of the reset AND gate 230 also has a signal in the HIGH state as provided at the output terminal 236 of the inverter 238 because the signal at the system input terminal 202 is in the LOW state. A HIGH signal state at any one of the input terminals 262, 264 causes the signal at the Q output terminal 260 of the R-S flip-flop to go to a LOW state. The legitimate input pulse signal 380 is thus reproduced as a delayed pulse signal 388, as indicated in FIG. 3.

Another legitimate positive input signal 393 similarly provides a delayed Q output signal 394. Note that a noise spike 396, which causes the legitimate input signal level to temporarily go to a LOW state for a duration less than the predetermined time delay, does not affect the state of the Q output signal.

Activation Sequence for the Logic Circuits

As previously mentioned, FIG. 3 shows a number of leadlines connected between the edges of various signals. The leadlines have arrowheads at one end to indicate that the signal with the arrowhead is changed as a result of the signal at the other end of the leadline. For example, the leadline connected between the signal edges 381, 385, indicates that the change in the INPUT signal from the LOW to the HIGH state as indicated by the rising edge 381 results in the change in the DELAY OUTPUT signal 384 as indicated by the rising edge 385.

The leadline from the rising edge 381 of the INPUT SIGNAL PULSE 380 produces the rising edge 385 of the DELAY OUTPUT pulse 384. The HIGH input signals to the AND gate 220 produce a HIGH output level at the input to the NOR gate 250, causing the output level of the NOR gate 250 to drop to a LOW state. This is illustrated by the leadline from the rising edge 385 of pulse 385 to the falling edge 387 of the INVERTED OUTPUT SIGNAL.

The leadline from the trailing edge 382 of the INPUT SIGNAL PULSE 380 produces the trailing edge 386 of the DELAY OUTPUT pulse 384. The LOW input signals to the NOR gate 210 produces a HIGH output level at its output terminal, as indicated by the rising edge 390. HIGH input levels to the AND gate 230 cause the input terminal of the NOR gate 252 to go to a HIGH state, causing the Q OUTPUT signal to drop to a LOW state as indicated by the falling edge 391.

Figure 4:
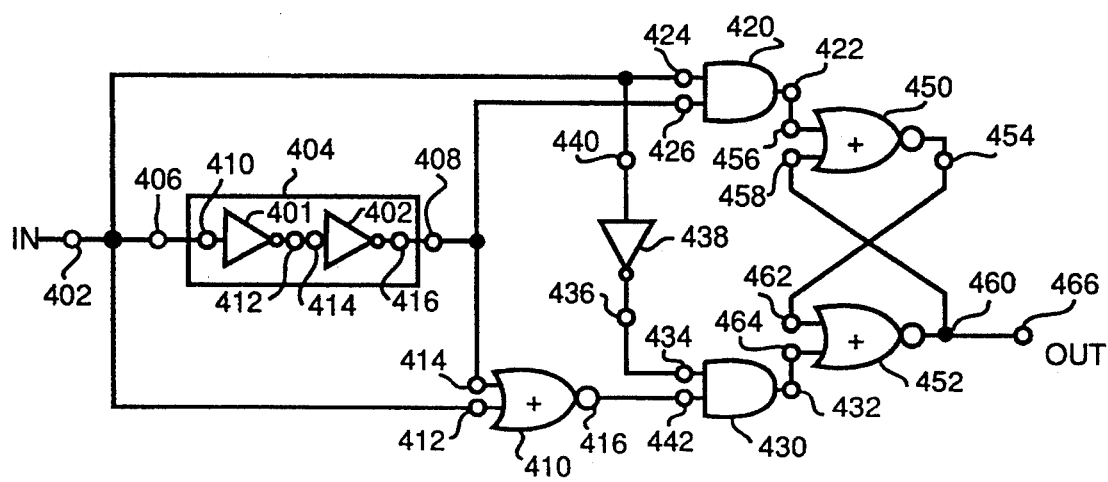
FIG. 4 is a circuit diagram of a logic noise-suppression system which uses a pair of inverters for a delay circuit.

FIG. 4 is a circuit diagram of an embodiment of a noise-suppression system 400, which is similar to the system 200 shown in FIG. 2 with a R-S flip-flop circuit formed of cross-coupled NOR gates. This embodiment uses a pair of serially-connected inverters 401, 402 for a delay circuit 404. The delay circuit 404 has an input terminal 406 and an output terminal 408. The input terminal 410 of the first inverter 401 is coupled to the input terminal 406 of the delay circuit 404. The output terminal 412 of the first inverter 401 is coupled to the input terminal 414 of the second inverter circuit 402. The output terminal 416 of the second inverter 402 is coupled to the output terminal 408 of the delay circuit 408.

A logic combining circuit is provided by a NOR gate 410 which has a first input terminal 412 coupled to the system input terminal 402. A second input terminal 414 is coupled to the output terminal 408 of the delay circuit 404. The NOR gate 410 has an output terminal 416 which provides a logic signal produced by the logical combination of signals at its input terminals. The function of the logic combining circuit is to monitor an input signal and a delayed version of the input signal in order to provide an output signal indicating that both the input signal and a delayed version of the input signal are at an inactive, or LOW, state.

A set circuit includes an AND gate 420 with its output terminal 422. A first input terminal 424 for the AND gate 420 is coupled to the system input terminal 402 for the system 400. A second input terminal 426 of the AND gate 420 is coupled to the output terminal 408 of the delay circuit 404. The set circuit functions to monitor an input signal and a delayed version of the input signal in order to provide an output signal indicating that both the input signal and a delayed version of the input signal are simultaneously at an active, or HIGH, state.

A reset circuit includes an AND gate 430 with an output terminal 432. A first input terminal 434 for the AND gate 430 is coupled to output terminal 436 of an inverter 438. The input terminal 440 of the inverter 438 is coupled to the system input terminal 402. The reset AND gate 430 has a second input terminal 442 coupled to the output terminal 416 of the logic combining circuit provided by the NOR gate 410. The reset circuit functions to monitor an inverted input signal and the signal at the output terminal of the logic combining NOR gate 410.

The R-S latch circuit includes a pair of cross-coupled NOR gates formed of a first NOR gate 450 and a second NOR gate 452. The first NOR gate 450 has an output terminal 454, a first input terminal 456, and a second input terminal 458. The second NOR gate 452 has an output terminal 460, a first input terminal 462, and a second input terminal 464. The output terminal 454 of the first NOR gate 450 is coupled to the first input terminal 462 of the second NOR gate 452. The first input terminal 456 of the first NOR gate 450 is coupled to the output terminal 422 of the set AND gate 420. The second input terminal 458 of the first NOR gate 450 is coupled to the output terminal 460 of the second NOR gate 452. The second input terminal 464 of the second NOR gate 452 is coupled to the output terminal 432 of the reset AND gate 430. The output terminal 460 of the second NOR gate 452 is connected to the Q output terminal 466 for the flip-flop formed by the NOR gates 450, 452.

Figure 5:
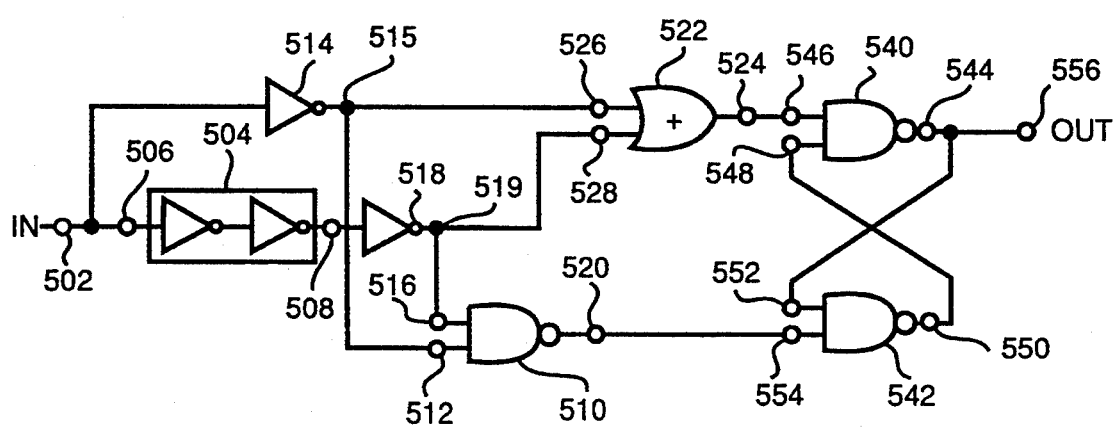
FIG. 5 is an alternative embodiment of a logic noise-suppression system, which uses a NAND flip-flop circuit.

FIG. 5 is an alternative embodiment of a noise-suppression system 500, which implements a R-S flip-flop circuit using a pair of cross-coupled NAND gates.

A system input terminal 502 receives an input signal, which can be either a desirable signal, which has a time duration, or width, greater than a predetermined time, or an undesirable, noise signal with a width less than a predetermined time.

A time-delay circuit 504 has an input terminal 506 coupled to the system input terminal 502. The delay time of the delay circuit 504 is set to the predetermined time. The time-delay circuit 504 includes an output terminal 508.

A logic combining circuit is provided by a NAND gate 510 which has a first input terminal 512 coupled to the system input terminal 502 through an inverter 514 which has an output terminal 515. A second input terminal 516 is coupled to the output terminal 508 of the delay circuit 504 through an inverter 518 with an output terminal 519. The NAND gate 510 has an output terminal 520 which provides a logic signal produced by the logical combination of signals at the input terminals to the NAND gate 510.

A set circuit includes an OR gate 522 with an output terminal 524. A first input terminal 526 for the OR gate 522 is coupled to the system input terminal 502 through inverter 514 for the system 500. A second input terminal 528 of the OR gate 522 is coupled through the inverter 518 to the output terminal 508 of the delay circuit 504.

In this embodiment of the invention, the R-S latch circuit includes a pair of cross-coupled NAND gates formed with a first NAND gate 540 and a second NAND gate 542. The first NAND gate 540 has an output terminal 544, a first input terminal 546, and a second input terminal 548. The second NAND gate 542 has an output terminal 550, a first input terminal 552, and a second input terminal 554. The output terminal 544 of the first NAND gate 540 is coupled to the first input terminal 552 of the second NAND gate 542. The first input terminal 546 of the first NAND gate 540 is coupled to the output terminal 524 of the set OR gate 522. The second input terminal 548 of the first NAND gate 540 is coupled to the output terminal 550 of the second NAND gate 542. The second input terminal 554 of the second NAND gate 542 is coupled to the output terminal 520 of the NAND gate 510. The output terminal 544 of the first NAND gate 540 is the Q output terminal for the flip-flop formed by the NAND gates 540, 542. Terminal 544 is coupled to the system output terminal 556.

Figure 6:
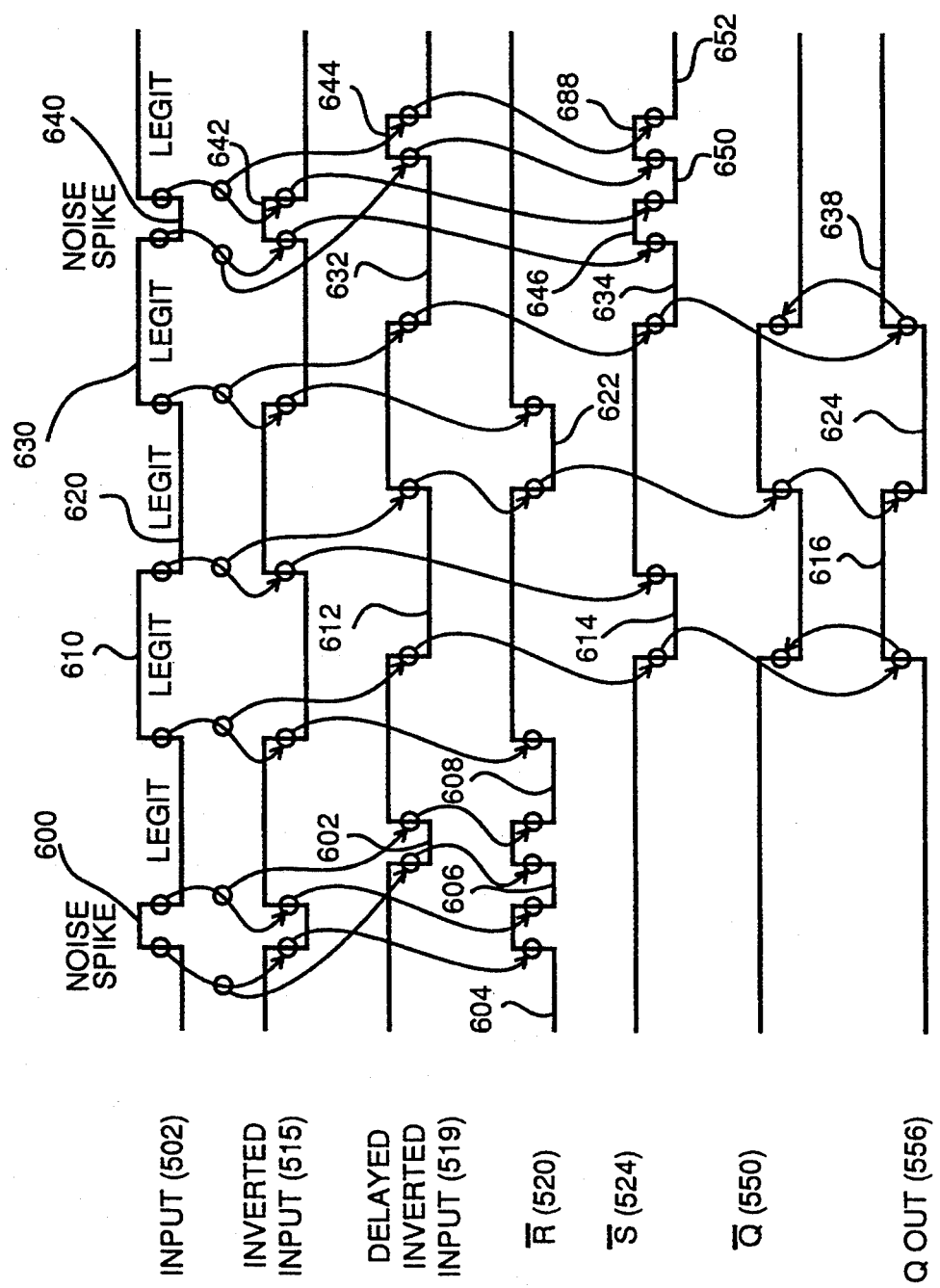
FIG. 6 is a timing diagram for operation of the circuit of FIG. 5, showing rejection of a spurious signal and acceptance of a legitimate signal.

FIG. 6 is a timing diagram illustrating operation of the circuit of FIG. 5, which uses a pair of cross-coupled NAND gates for the R-S flip-flop. FIG. 6 shows a number of leadlines connected between the edges of various signals to illustrate operation sequences for the logic circuits. The leadlines have arrowheads at one ends to indicate that the signal with the arrowhead is changed as a result of the signal at the other end of the leadline. The diagram shows, respectively from top to bottom: a typical INPUT signal provided at the system input terminal 502; an INVERTED INPUT signal provided at the output terminal 515 of the inverter 514; an inverted DELAYED OUTPUT signal provided at the output terminal 519 of inverter 518; a $\overline{SET}$ signal provided at the output terminal 524 of the OR gate 522; a $\overline{RESET}$ signal provided at the output terminal 520 of the NAND gate 510; an INVERTED OUTPUT signal provided at terminal 550 of the RS flip-flop; and a Q OUTPUT signal for the noise-suppression system provided at the Q output terminal 556 of the R-S flip-flop.

Response to a Noise Pulse

A noise spike, or pulse, 600 having a width slightly less than the delay time of the delay circuit 504, appears at the system input terminal 502. The delay circuit 504 has a delay slightly greater than the width of the noise pulse 600. The delay circuit 504 provides an inverted delayed pulse 602. The trailing edge of the noise pulse 600 occurs before the leading edge of the inverted delayed pulse 602. Consequently, the signals at the input terminals 526, 528 of the $\overline{SET}$ OR gate 522 do not simultaneously have LOW inputs and the $\overline{SET}$ signal at terminal 524 remains HIGH. Thus, the output signal at terminal 556 is not set and remains in a LOW state.

The signals at the input terminals 516, 512 of the logic combining NAND gate 510 cause the $\overline{RESET}$ signal at the output terminal 520 of the NAND gate 510 to go to a LOW state, as indicated by the signals 604, 606, 608. These low signals 604, 606, 608 attempt to reset the output signal at terminal 556. However, the output signal is already in a LOW, or reset, condition, so that the low signals 604, 606, 608 are "don't care" signals and have no effect on the state of the output signal. Once the output signal at terminal 556 is reset by the $\overline{RESET}$ signal, the $\overline{RESET}$ signal has no further effect, no matter what its state. The output state can then only be affected by the $\overline{SET}$ signal at terminal 524 going to a LOW state.

Response to Legitimate Signals

A legitimate positive signal pulse 610, having a width significantly greater than the delay time of the delay circuit 504 is provided at the system input terminal 502. The legitimate signal pulse 610 has a rising, leading edge and a falling trailing edge. The delay circuit 504 has a delay significantly less than the width of the legitimate signal pulse 610. The delay circuit 504 provides a delayed output pulse 612 at terminal 519 which is an inverted time-delayed version of the input signal pulse 610.

When the HIGH input pulse exceeds the time delay of circuit 504, the signals at the output terminal 515 of the inverter 514 and at the output terminal 519 of the inverter 518, both go LOW. So the output signal at terminal 524 of the OR gate 522 goes LOW as indicated by the pulse 614. This signal is the $\overline{SET}$ signal, which causes the Q output of the NAND gate 540 to go HIGH as indicated by the signal pulse 616. Once the output is HIGH, any further action on the $\overline{SET}$ input has no effect. The output can then only be affected by the $\overline{RESET}$ signal going to a LOW state.

When a legitimate LOW input pulse 620 exceeds the time delay of circuit 504, the output signal at terminal 519 goes HIGH. This causes the pulse 622 at terminal 520 of NAND gate 510 to go LOW. This is the $\overline{RESET}$ input to the latch which causes terminal 550 to go HIGH and the Q output signal 624 at terminal 556 to go LOW. Once the output is LOW, any further action on the $\overline{RESET}$ input has no effect.

Another legitimate HIGH pulse 630, which has a duration greater than the time delay of circuit 504, results in a pulse 632 LOW state at terminal 519. This pulse combines with the LOW state at terminal 515 to provide a $\overline{SET}$ pulse 634, which produces a HIGH output state for pulse 638. A negative noise spike 640 produces a pulse 642 at terminal 515 and a pulse 644 at terminal 519. These pulses produce respective $\overline{SET}$ signals, 650 and 652, which attempt to set the output to a HIGH state, but the output is already at a HIGH state. Once the output is HIGH, any further action on the $\overline{SET}$ input has no effect. The output can then only be affected by the $\overline{RESET}$ signal going to a LOW state.

Figure 7:
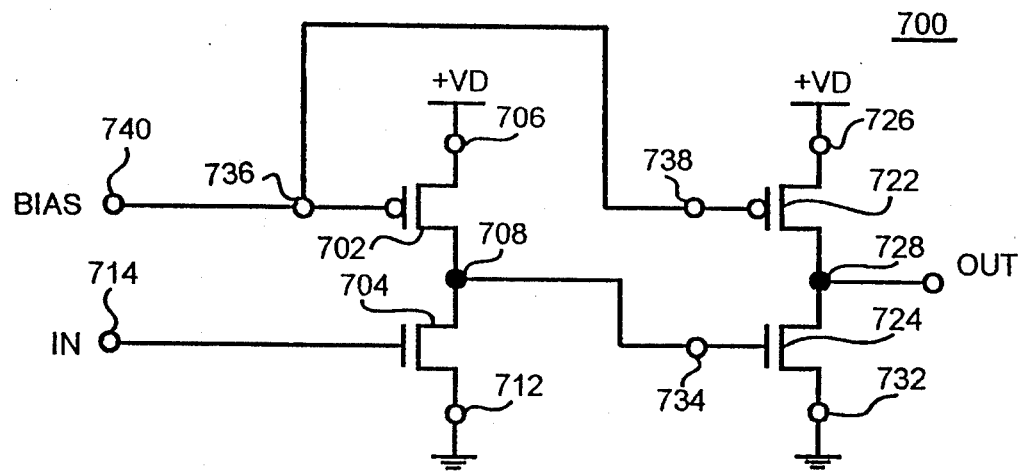
FIG. 7 is a circuit diagram for a current-controlled delay circuit.

FIG. 7 shows a circuit diagram of an alternative delay circuit 700, which provides a current-controlled delay. A first inverter circuit includes a n-channel transistor 704 which uses a p-channel transistor 702 as a load. The drain terminal 706 of the p-channel transistor 702 is connected to a positive voltage source VD. The source terminal of the P-channel transistor 702 is coupled to the drain terminal of the n-channel transistor 704 at an output terminal 708 for the first CMOS inverter. The source terminal of the n-channel transistor 704 is coupled to a ground potential. A signal input terminal 714 for the delay circuit 700 is coupled to the gate terminal of the n-channel transistor 704.

The output terminals 708 of the first CMOS inverter is coupled to the input terminal 734 of a second CMOS inverter 722, 724. The second CMOS inverter includes a p-channel transistor 722 in series with a n-channel transistor 724. The drain terminal 726 of the p-channel transistor 722 is connected to the positive voltage source VI). The source terminal of the p-channel transistor 722 is coupled to the drain terminal of the n-channel transistor 724 at an output terminal 728 for the second CMOS inverter. The source terminal 732 of the n-channel transistor 724 is coupled to the ground voltage source.

The gate terminal 736 of the p-channel transistor 702 and the gate terminal 738 of the second CMOS inverter P-Channel transistor 722 are both connected to a bias terminal 740. The p-channel transistors 702, 722 respectively serve as load impedances for the n-channel transistors 704, 724. A control voltage applied to the bias terminal 740 changes the impedances of the p-channel transistors 702, 722 which changes the current available so that the delay times of these inverters can be controlled.

Figure 8:
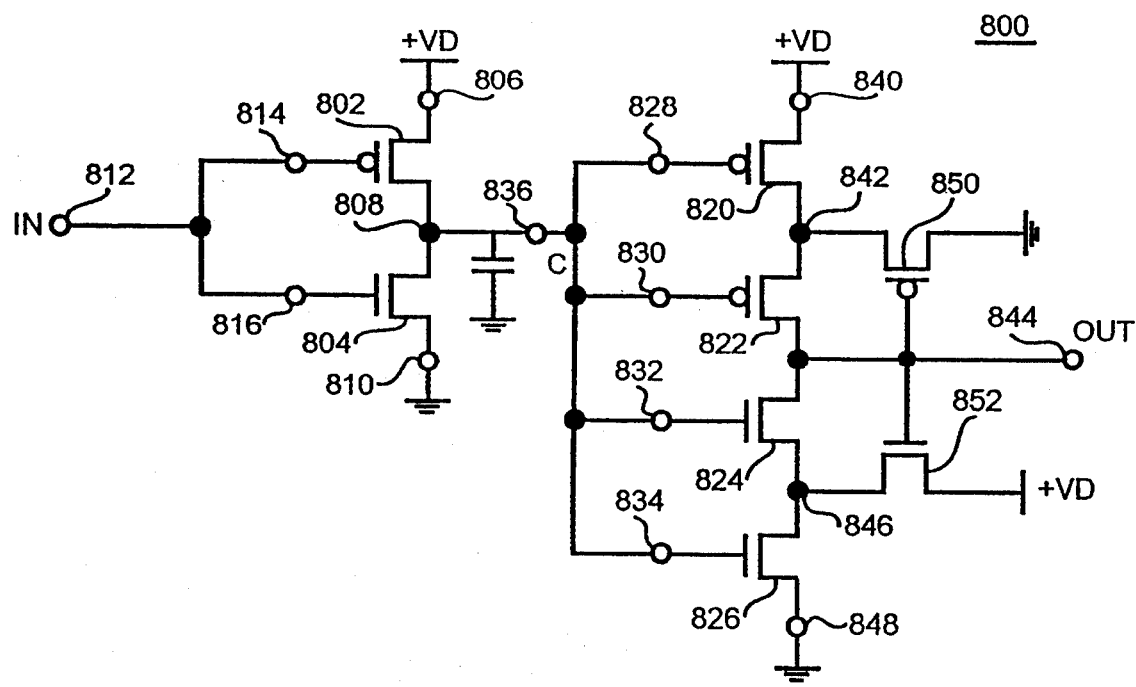
FIG. 8 is circuit diagram for a delay circuit which uses a charging capacitor as a delay-control element.

FIG. 8 shows a circuit diagram of another alternative Schmidt-trigger delay circuit 800, which uses a charging capacitor C as a delay-control element, where the value of C determines the delay time. A CMOS inverter circuit includes a p-channel transistor 802 in series with a n-channel transistor 804. The drain terminal 806 of the p-channel transistor 802 is connected to a positive voltage source $V_D$. The source terminal 808 of the p-channel transistor 802 is coupled to the drain terminal of the n-channel transistor 804 and an output terminal 808 for CMOS inverter. The source terminal 810 of the n-channel transistor 804 is coupled to a ground potential. A signal input terminal 812 for the delay circuit 800 is coupled to the gate terminal 814 of the p-channel transistor 802 and to the gate terminal 816 of the n-channel transistor 804.

A CMOS Schmidt-trigger circuit includes four transistors connected in series. A first p-channel transistor 820, a second p-channel transistor 822, a first n-channel transistor 824, and a second n-channel transistor 826 all have their respective gate terminals 828, 830, 832, 834 connected to a common input terminal 836. The drain terminal 840 of the p-channel transistor 820 is connected to the positive voltage source $V_D$. The source terminal of the p-channel transistor 820 is coupled to a terminal 842 and the drain terminal of the n-channel transistor 822. The source terminal of the p-channel transistor 822 is coupled to an output terminal 844 of the delay circuit 800. The drain terminal of the N-channel transistor 824 is also coupled to the output terminal of the delay circuit 800. The source terminal of the first n-channel transistor 824 is coupled to the drain terminal of the second n-channel transistor 826 and to a terminal 846. The source terminal 848 of the second n-channel transistor 826 is connected to the ground voltage source.

A p-channel feedback transistor 850 has its drain terminal connected to the terminal 842 and its source terminal connected to the ground voltage source. The gate terminal of the p-channel feedback transistor 850 is connected to the output terminal 844 of the delay circuit 800. An n-channel feedback transistor 852 has its drain terminal connected to the terminal 846 and its source terminal connected to the positive voltage source VD. The gate terminal of the n-channel feedback transistor 852 is connected to the output terminal 844 of the delay circuit 800.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A logic noise-suppression system for logically suppressing a noise signal having a time duration which is less than a predetermined time, comprising:
   a system input terminal for receiving an input signal;
   a delay circuit, having an input terminal coupled to the system input terminal and having an output terminal, where the delay time of the delay circuit is equal to the predetermined time;
   a logic combining circuit, having a first input terminal coupled to the system input terminal, having a second input terminal coupled to the output terminal of the delay circuit, and having an output terminal, the logic combining circuit providing an output signal;
   a R-S latch circuit, having a RESET input terminal, a SET input terminal, and an OUTPUT terminal for providing a delayed output signal corresponding to an input signal which has a time duration greater than the predetermined time;
   a set circuit, having a first input terminal coupled to the system input terminal, having a second input terminal coupled to the output terminal of the delay circuit, and having an output terminal coupled to the SET input terminal of the R-S flip-flop circuit;
   a reset circuit, having a first input terminal coupled through an inverter to the system input terminal, having a second input terminal coupled to the output terminal of the logic combining circuit, and having an output terminal coupled to the RESET input terminal of the R-S flip-flop circuit.

2. The system of claim I wherein the logic combining circuit includes a NOR gate, wherein the R-S latch circuit includes a pair of cross-coupled NOR gates, wherein the set circuit includes an AND gate, and wherein the reset circuit includes an AND gate.

3. The system of claim 1 wherein the logic combining circuit includes a NAND gate, wherein the R-S latch circuit includes a pair of cross-coupled NAND gates, wherein the set circuit includes an OR gate.

4. The system of claim 1 wherein the wherein the delay circuit includes two, serially connected inverter circuits.

5. The system of claim 4 including a shunt capacitor connected to the input terminal of the second of the two, serially connected inverter circuits.

6. The system of claim 4 wherein the delay circuit includes means for adjustably controlling the circuit delay.

7. The circuit of claim 4 wherein the means for adjustably controlling the circuit delay includes means for controlling the current through the inverter circuits.

8. A noise-suppression system for suppressing a noise signal having a time duration which is less than a predetermined time, comprising:
   a circuit input terminal for receiving an input signal;

a delay circuit, having an input terminal coupled to the circuit input terminal and having an output terminal, where the delay time of the delay circuit is equal to the predetermined time;

a NOR gate, having a first input terminal coupled to the circuit input terminal, having a second input terminal coupled to the output terminal of the delay circuit, and having an output terminal;

an inverter, having an input terminal coupled to the circuit input terminal and having an output terminal;

a first AND gate, having a first input terminal coupled to the circuit input terminal, having a second input terminal coupled to the output terminal of the delay circuit, and having an output terminal;

a second AND gate, having a first input terminal coupled to the output terminal of the NOR gate, having a second input terminal coupled to the output terminal of the inverter, and having an output terminal;

a R-S latch circuit including:
  a first NOR gate, having a first input terminal coupled to the output terminal of the first AND gate, having a second input terminal, and having an output terminal; and
  a second NOR gate, having a first input terminal coupled to the output terminal of the first NOR gate, having a second input terminal coupled to the output terminal of the second AND gate, and having an output terminal coupled to the second input terminal of the first NOR gate;
  an output terminal coupled to the output terminal of the second NOR gate of the R-S latch for providing a delayed output signal corresponding to an input signal which has a time duration greater than the predetermined time.

9. The system of claim 8 wherein the delay circuit includes two, serially connected inverter circuits.

10. The system of claim 8 including a shunt capacitor connected to the input terminal of the second of the two, serially connected inverter circuits.

11. The system of claim 8 wherein the delay circuit includes means for adjustably controlling the circuit delay.

12. The circuit of claim 8 wherein the means for adjustably controlling the circuit delay includes means for controlling the current through the inverter circuits.

13. A noise-suppression system for suppressing a noise signal having a time duration which is less than a predetermined time, comprising:
  a circuit input terminal for receiving an input signal;
  a delay circuit, having an input terminal coupled to the circuit input terminal and having an output terminal, where the delay time of the delay circuit is equal to the predetermined time;
  a first inverter, having an input terminal coupled to the circuit input terminal and having an output terminal;
  a second inverter, having an input terminal coupled to the output terminal of the delay circuit and having an output terminal;
  a first NAND gate, having a first input terminal coupled to the output terminal of the second inverter and having a second input terminal coupled to the output terminal of the first inverter circuit, and having an output terminal;
  an OR gate, having a first input terminal coupled to the output terminal of the first inverter circuit, having a second input terminal coupled to the output terminal of the second inverter circuit, and having an output terminal; and
  a R-S latch circuit including:
    a second NAND gate, having a first input terminal coupled to the output terminal of the first OR gate, having a second input terminal, and having an output terminal;
    a third NAND gate, having a first input terminal coupled to the output terminal of the first NAND gate, having a second input terminal coupled to the output terminal of the second NAND gate, and having an output terminal coupled to the second input terminal of the second NAND gate;
    an output terminal coupled to the output terminal of the second NAND gate of the R-S latch for providing a delayed output signal corresponding to an input signal which has a time duration greater than the predetermined time.

14. The circuit of claim 13 wherein the delay circuit includes two, serially connected inverter circuits.

15. The circuit of claim 13 including a shunt capacitor connected to the input terminal of the second of the two, serially connected inverter circuits.

16. The circuit of claim 13 wherein the delay circuit includes means for adjustably controlling the circuit delay.

17. The circuit of claim 13 wherein the means for adjustably controlling the circuit delay includes means for controlling the current through the inverter circuits.

18. A method for logically suppressing a noisy input signal having a time duration which is less than a predetermined time, comprising the steps of:
  delaying the noisy input signal for the predetermined time through a delay circuit and providing a delayed input signal at an output terminal of the delay circuit;
  combining the input signal with the delayed input signal in a logic combining circuit and providing a combined logic signal at ark output terminal of the logic combining circuit;
  providing a set signal for an RS latch circuit by logically combining the input signal with the delayed input signal in a set circuit;
  providing a reset signal for the RS latch circuit by logically combining the combined logic signal with an inverted signal of the input signal in a reset circuit;
  providing a delayed output signal from the RS latch circuit corresponding to the input signal which has a time duration greater than the predetermined time.

* * * * *